United States Patent [19]

Aranovich

[11] Patent Number: 5,382,339
[45] Date of Patent: Jan. 17, 1995

[54] SHIELD AND COLLIMATOR PASTING DEPOSITION CHAMBER WITH A SIDE POCKET FOR PASTING THE BOTTOM OF THE COLLIMATOR

[75] Inventor: Julio A. Aranovich, Palo Alto, Calif.

[73] Assignee: Applied Materials, Inc., Santa Clara, Calif.

[21] Appl. No.: 123,420

[22] Filed: Sep. 17, 1993

[51] Int. Cl.6 .................... C23C 14/34; C23C 14/35
[52] U.S. Cl. ................. 204/192.12; 204/298.11; 204/298.25; 204/298.26
[58] Field of Search .............. 204/192.12, 298.11, 204/298.25, 298.26

[56] References Cited

U.S. PATENT DOCUMENTS

| | | | |
|---|---|---|---|
| 4,410,407 | 10/1983 | Macaulay | 204/192.25 |
| 4,824,544 | 4/1989 | Mikalesen et al. | 204/298.06 |
| 4,986,890 | 1/1991 | Setoyama et al. | 204/298.06 |
| 5,065,698 | 11/1991 | Koike | 118/719 |
| 5,202,008 | 4/1993 | Talich et al. | 204/192.32 |
| 5,223,108 | 6/1993 | Hurwitt | 204/192.12 |

FOREIGN PATENT DOCUMENTS

| | | | |
|---|---|---|---|
| 0511733 | 11/1992 | European Pat. Off. | 204/298.11 |
| 61-201771 | 9/1986 | Japan | 204/298.11 |
| 4-193946 | 7/1992 | Japan | 204/298.11 |

Primary Examiner—Aaron Weisstuch
Attorney, Agent, or Firm—Thomas B. Haverstock

[57] ABSTRACT

A deposition chamber used in the physical vapor deposition of wafers has a side pocket for pasting the bottom of a collimator. To prolong the useful life of a collimator it is rotated into the side pocket and the bottom is pasted with a pasting material which is resistant to cracking and flaking. A series of wafers are cycled through the deposition chamber. While each wafer is in the deposition chamber a deposition material is sputtered onto its surface. After a predetermined number of wafers are sputtered in the deposition chamber a pasting cycle is run. During the pasting cycle, a pasting material is sputtered over the deposition chamber and the top of the collimator. The collimator is then moved into the side pocket of the deposition chamber and a pasting material is sputtered from a second target over the bottom of the collimator. The pasting material serves to resist cracking and flaking of the deposition material and thus prolongs the useful life of the shields in the deposition chamber and the collimator.

26 Claims, 2 Drawing Sheets

shield and collimator pasting deposition chamber with a side pocket for pasting the bottom of the collimator

FIELD OF THE INVENTION

The present invention relates to the field of physical vapor deposition of material onto wafers, also called sputtering. More specifically, the present invention relates to the field of physical vapor deposition of wafers in a deposition chamber.

BACKGROUND OF THE INVENTION

During the physical vapor deposition of wafers, a deposition chamber, as illustrated in FIG. 1, is used to sputter the deposition material on a wafer 4. This deposition material can be any compound which is commonly used in the physical vapor deposition of wafers. Aluminum, an alloy of aluminum, titanium, tungsten, and a composite of titanium and tungsten are commonly used as deposition materials. A target 2 is formed out of the deposition material to be used.

The wafer 4 is supported by a pedestal 5. Typically, the target is positioned at the top of the deposition chamber and the pedestal is positioned at the bottom of the deposition chamber. A shield 6 is positioned within the interior of the deposition chamber to prevent target material from being deposited on the interior walls of the chamber.

As is well known, a plasma of a gas, e.g., argon, is formed in the chamber. Ions from the plasma are attracted to the target by applying an appropriate voltage to the target. For example, a plasma can be formed by applying a sufficiently large DC voltage between the cathode, e.g., the target 2, and the anode, e.g., the shields 6. By applying the negative terminal of the voltage supply to the target 2, the ions in the plasma will be attracted to the target 2 as the plasma is formed. As the plasma ions strike the target 2, particles are sputtered from the surface of the target 2 at a significant kinetic energy.

A magnetron 1 can be used to shape the plasma and the flow of ions to the target 2. The term magnetron in the field of the present invention can include one or more permanent magnets or electro-magnets of appropriate strength, orientation, and position to achieve the desired shaping. Additionally, the magnetron magnets can be moved during a deposition process to provide uniform plasma flow to the target. The magnetron magnets can be moved by a motor.

In this deposition chamber, it is also possible to conduct reactive sputtering using more than one element to make up the deposition material. To conduct reactive sputtering and deposit a compound consisting of more than one element on the wafer 4, a gas of the second element is introduced into the deposition chamber inside the area enclosed by the shield 6. The first element is still obtained from the target 2 as described above. As the sputtered particles from the target 2 are travelling away from the target 2, they react with the gas particles on their way to the wafer 4, forming a reactive compound which is then deposited on the wafer 4.

Most of the reactive compounds used for reactive sputtering cannot exist in thick layers on an object without breaking up or flaking. For example, compounds such as titanium-nitride, which are commonly used in reactive sputtering, are high stress materials and can only exist in very thin layers without breaking up or flaking. When the layers of these types of reactive compounds become too thick they tend to crack and break apart, introducing extraneous and unwanted particles into the deposition chamber.

After the deposition of multiple wafers, the layer of the reactive deposition compound thickens on the interior walls of the shield 6. This reactive compound layer will then begin to flake and crack, introducing extraneous particles within the interior of the shield 6. These particles will damage the deposition of future wafers and will detract from the purity of the layer deposited on the surface of the wafer 4.

Because of the particles created from the flaking of thick layers of reactive compounds, it is necessary to periodically replace the shield 6. The deposition chamber cannot be used during the time that the shield 6 is being replaced, costing the owner valuable production throughput time, and the cost of the new shield can also be expensive.

As illustrated in FIG. 3, a different but related problem results when a collimator 3 is positioned between the target 2 and the wafer 4 inside of the deposition chamber. The collimator 3 filters the moving particles of the target material so that only particles travelling within a predetermined range of angles can strike the wafer. The collimator 3 has holes 7 which extend through its depth, allowing the particles sputtered from the target 2 to pass through the collimator 3 if they are projected through a hole 7 without ricocheting from the walls of the holes 7. During deposition the particles sputtered from the target 2 travel through the holes 7 and are deposited on the wafer 4. The collimator 3 also has a surface 8 between each of the holes 7 and the interior sidewalls 9 of the holes. The ratio of the depth of the holes 7 to the diameter of the holes 7 is called the aspect ratio. Some of the particles sputtered from the target 2 will be deposited on top of the surface 8 and on the interior sidewalls 9 of the holes 7 as well as on the interior surface of the shield 6.

After a vacuum is formed, a partial pressure of a gas is formed in the chamber to aid in the formation of plasma. The partial pressure is typically in the range of 0.5–20 mTorr of a gas, e.g., argon. During a reactive deposition nitrogen gas will also be introduced into the chamber to react with the target material being deposited. As illustrated in FIG. 2, at least a portion of the particles of target material will strike a gas molecule or a plasma ion after such a particle passes through the collimator 3. Occasionally, a particle of target material 12 will ricochet from the gas molecule 14 or ion while losing much of its kinetic energy to the gas molecule as shown in FIG. 2. At least a portion of these slow moving particles will adhere loosely to the underside of the collimator 3. A layer formed from such slow moving particles is likely to flake more readily than even those on the shield.

One method to solve this problem was introduced by Tepman in the jointly owned U.S. patent application No. 08/075,259, filed Jun. 11, 1993. This method teaches the use of an acceptor placed at the bottom of the deposition chamber to paste the shields and the bottom of the collimator with a material, here aluminum, which binds the brittle TiN layers together so they do not flake.

What is needed is an apparatus and method which will allow the shield and collimator to be used for a longer period of time in the deposition of reactive compounds without creating flakes and extraneous particles inside of the deposition chamber.

SUMMARY OF THE INVENTION

A deposition chamber allows the collimator to be used for longer periods of time without flaking or forming particles while requiring less frequent replacement periods. A primary apparatus deposits a target material onto an object such as a semiconductor wafer. The apparatus for depositing a target material includes a source having a target, means for generating a plasma and for attracting the ions in the plasma to the target so that particles of the target are sputtered and deposited on the surface of the wafer. The apparatus may include a primary magnetron to shape the plasma and the flow of ions to the target.

The deposition chamber has a first target of deposition material positioned in the deposition chamber and a second target positioned in a side pocket of the deposition chamber. The deposition chamber comprises means for bombarding the first target with ions for sputtering the deposition material and means for bombarding the second target with ions for sputtering a pasting material from the second target. The deposition chamber also may comprise a second magnetron positioned below the second target for shaping the plasma and a flow of ions to the second target. The deposition chamber also comprises a selectably positionable collimator which is positioned either in the deposition chamber during the sputtering of wafers or in the side pocket for pasting the bottom of the collimator.

An inventive method for the physical vapor deposition of wafers in a deposition chamber has a first target positioned near the top of the chamber and a second target positioned in a side pocket of the chamber. The method comprises the steps of bombarding the first target with ions for depositing material from the target onto a predetermined number of wafers sequentially and periodically moving the collimator into the side pocket of the chamber and bombarding the second target with ions for depositing a pasting material from the second target onto the bottom of the collimator.

DETAILED DESCRIPTION OF THE PREFERRED EMBODIMENT

Figure 1:
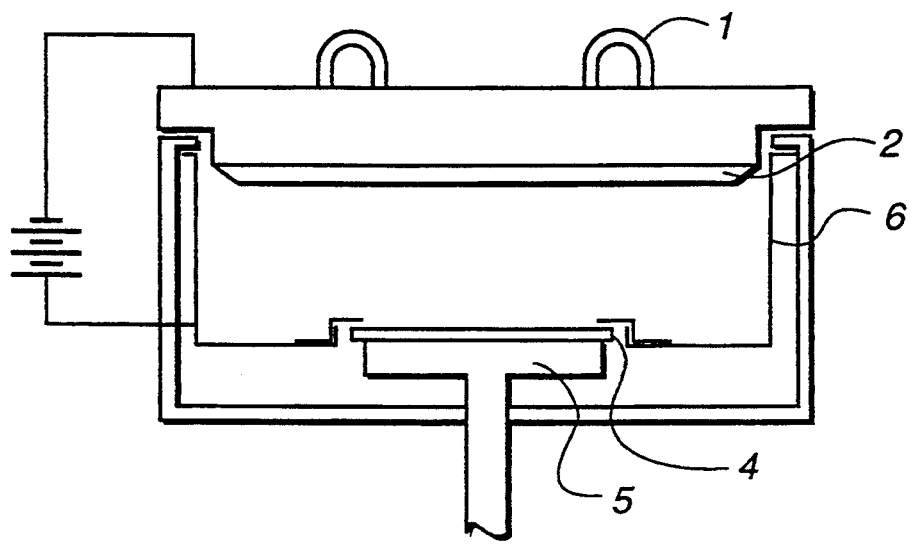
FIG. 1 illustrates a deposition chamber of the prior art.
Figure 2:
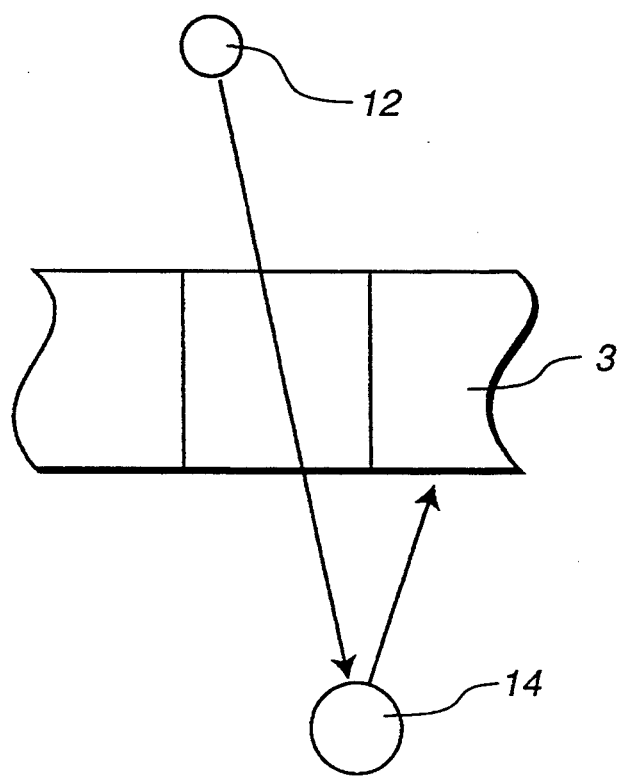
FIG. 2 illustrates a ricocheting target material particle.
Figure 3:
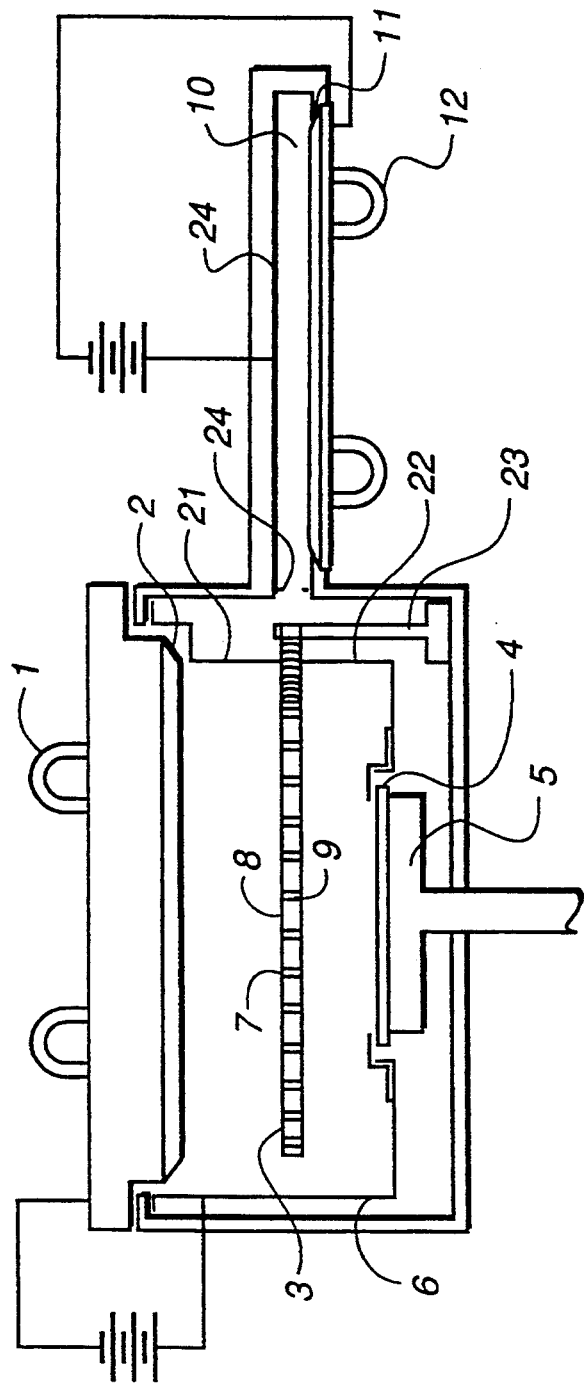
FIG. 3 illustrates a deposition chamber of the present invention including a rotating collimator and side pocket.

A deposition chamber of the present invention is illustrated in FIG. 3. The chamber includes a source having a first or primary target 2. The apparatus may include a primary magnetron 1 to shape the plasma and the flow of ions to the primary target 2. The interior of the chamber is protected by a shield 6. A second target 11 is positioned at the bottom of the side pocket 10 for pasting the bottom of the collimator 3. The secondary target 11 is made out of a pasting material such as aluminum or titanium which will not crack or flake when deposited in thick layers and which will readily adhere to another deposition material when deposited on top of it. The apparatus may include a secondary magnetron 12 to shape the plasma and the flow of ions to the secondary target 11.

During a deposition cycle, the chamber is evacuated of air and a partial pressure of a gas, e.g., argon, is introduced. A plasma is formed of the argon by applying a DC voltage between the shield 6 and the source wherein the negative terminal is coupled to the target 2. This electrical coupling also acts to attract the ions of the plasma to the target for sputtering.

A plurality of wafers 4 are serially cycled through the deposition chamber of the present invention. As the wafers 4 are cycled through the deposition process, the target material is sputtered onto the surface of each wafer 4. The material is also deposited on the interior of the shield 6 and on the underside 8 of the collimator 3.

As the deposited material becomes thick, it can flake. The material deposited on the underside of the collimator 3 is prone to crack and flake. To prevent cracking and flaking of this deposited material, a layer of pasting material which is resistant to cracking and flaking is periodically deposited on the underside of the collimator 3 in order that the layer of high stress material will not be allowed to become thick enough to crack or flake.

In order to prevent cracking and flaking of the deposited material on the bottom of the collimator 3, it is moved into the side pocket 10 and a layer of pasting material which is resistant to cracking and flaking is deposited over the surface of the bottom of the collimator 3. In the preferred embodiment, the collimator 3 is held and rotated by the vertical shaft 23 attached to a side of the collimator 3. During deposition of wafers and the pasting of the shield 6, the collimator 3 is positioned in the deposition chamber. After the pasting of the shield 6, the power supply between the shield 6 and the primary target 2 is disconnected, the collimator 3 is rotated into the side pocket 10, a power supply is turned on between a shield 24 for the side pocket and the secondary target 11, and the bottom of the collimator 3 is pasted with deposition material obtained from the secondary target 11. The apparatus may include a secondary magnetron 12 to shape the plasma and the flow of ions to the second target 11.

The rotating vertical shaft 23 has a horizontal arm which holds the collimator 3. The shield 6, on the side of the chamber where the rotating vertical shaft 23 is positioned, has a bottom portion 22 and a top portion 21. Both the top portion 21 and the bottom portion 22 of the shield 6 extend to almost touch the horizontal arm of the vertical shaft 23. The side pocket 10 also has a shield 24 which is used to protect the inside of the deposition chamber during pasting of the bottom of the collimator 3. The side pocket shield 24 also has a top and bottom portion which extend to almost touch the horizontal arm of the vertical shaft 23 when the shaft 23 is rotated so that the collimator 3 is positioned inside of the side pocket 10.

The layer of pasting material deposited onto the bottom of the collimator 3 will form a barrier to cracking and flaking between the layers of the high stress material. This barrier will not allow the individual layers of the high stress material to become thick enough that they can crack or flake. By depositing this barrier layer of pasting material, the thickness of the layers of the high stress material inside the deposition chamber can be controlled and the lifetime of the collimator 3 can be extended.

The secondary target 11 periodically will require replacement as the pasting material is depleted by the pasting of the interior of the shield 6. Because the primary target 2 must also be replaced periodically, it will be efficient to replace both the first and second targets at the same time. The equipment operator may also find it efficient to change the shields and/or collimator as the first and second targets are replaced.

During a deposition process using the present invention, a plurality of wafers are cycled through the deposition chamber and the deposition material is deposited on the surface of the wafers 4. After this plurality of wafers have cycled through the deposition chamber a pasting cycle is performed in the pocket on the underside of the collimator 3 by rotating the collimator 3 into the pocket. A portion of the shield 6 is retracted to allow the collimator 3 to be moved from the chamber into the pocket 10.

This process will deposit a layer of pasting material between thin layers of the reactive compound so that the high stress material will not accumulate into thick layers which will crack or flake and introduce unwanted particles into the deposition chamber. In the preferred embodiment of the present invention a pasting cycle is performed periodically, generally after a predetermined number of wafers have received a deposition of target material.

It will be apparent to one of ordinary skill in the art that various modifications may be made to the preferred embodiment without departing from the spirit and scope of the invention as defined by the appended claims.

I claim:

1. An apparatus comprising:
   a deposition chamber having a primary chamber and a side pocket;
   a collimator and a first target of a first deposition material for use in the physical vapor deposition onto a wafer in the primary chamber;
   a second target of a second deposition material positioned in the side pocket of the deposition chamber for deposition on an underside of the collimator;
   a primary plasma generator in the first chamber for generating plasma ions therein and for bombarding the first target with ions for sputtering the first deposition material;
   a second plasma generator in the side pocket for generating plasma ions therein and for bombarding the second target with ions for sputtering the second deposition material; and
   a positioner for selectively positioning the collimator in either the primary chamber or the side pocket.

2. The apparatus as claimed in claim 1 further comprising a shield and means for retracting the shield as the collimator is moved between the primary chamber and the side pocket.

3. The apparatus as claimed in claim 1 wherein the first plasma generator comprises:
   a. a means for evacuating air from the primary chamber;
   b. a valve for introducing a partial pressure of a gas into the primary chamber; and
   c. a voltage supply for forming a plasma of the gas, 4. The apparatus chamber as claimed in claim 1 wherein the first plasma generator comprises a voltage supply biased for attracting ions from the plasma to the first target to sputter the deposition material.

5. The apparatus as claimed in claim 1 wherein the second plasma generator comprises:
   a. a means for evacuating air from the side pocket;
   b. a valve for introducing a partial pressure of a gas into the side pocket; and
   c. a voltage supply for forming a plasma of the gas.

6. The apparatus as claimed in claim 5, wherein said second plasma generator comprises a voltage supply biased for attracting ions from the plasma to the second target to sputter the deposition material.

7. The apparatus as claimed in claim 1 wherein the first deposition material is a reactive compound formed from a first element obtained from the first target and a second element obtained from a second gas introducible into the deposition chamber.

8. The apparatus as claimed in claim 1 wherein said collimator is a rotatably positionable collimator having a first position within the primary chamber and a second position within the side pocket.

9. The apparatus as claimed in claim 1 wherein the positioner comprises a rotatable axis for selectively positioning the collimator between the primary chamber and the side pocket.

10. An apparatus comprising:
    a deposition chamber having a primary chamber and a secondary chamber;
    a collimator and a first target of deposition material for use in the physical vapor deposition onto a wafer in the primary chamber;
    a second target positioned in the secondary chamber of the deposition chamber for deposition on an underside of the collimator;
    means for bombarding the first target with ions for sputtering the deposition material;
    means for bombarding the second target with ions for sputtering a pasting material; and
    means for selectively positioning the collimator in either the primary chamber or the secondary chamber.

11. The apparatus as claimed in claim 10 further comprising a shield and means for retracting the shield as the collimator is moved between the primary and secondary chambers.

12. The apparatus as claimed in claim 10 wherein the means for bombarding the first target with ions comprises:
    a. means for evacuating air from the primary chamber;
    b. means for introducing a partial pressure of a gas into the primary chamber;
    c. means for forming a plasma of the gas; and
    d. means for attracting ions from the plasma to the first target to sputter the deposition material.

13. The apparatus as claimed in claim 12 further comprising a first magnetron positioned above the first target for shaping the plasma and a flow of ions to the first target.

14. The apparatus as claimed in claim 13 wherein the means for bombarding the second target with ions comprises:
    a. means for evacuating air from the secondary chamber;
    b. means for introducing a partial pressure of a gas into the secondary chamber;
    c. means for forming a plasma of the gas; and
    d. means for attracting ions from the plasma to the second target to sputter the pasting material.

15. The apparatus as claimed in claim 14 further comprising a second magnetron positioned below the second target for shaping the plasma and a flow of ions to the second target.

16. The apparatus as claimed in claim 10 wherein the deposition material is a reactive compound formed from a first element obtained from the first target and a second element obtained from a second gas introducible into the deposition chamber.

17. The apparatus as claimed in claim 10 further comprising a rotatably positionable collimator having a first position and a second position.

18. The apparatus as claimed in claim 10 wherein the means for selectively positioning the collimator comprises a rotatable axis for selectively positioning it between the primary and secondary chambers.

19. A method for the physical vapor deposition onto a plurality of wafers inside of a deposition chamber, comprising the steps of:

positioning a first target of a deposition material near the top of the chamber;

positioning a second target of a pasting material in a side pocket of the chamber;

bombarding the first target with ions to generate particles of said deposition material which pass through a collimator for depositing material form the target onto a predetermined number of wafers sequentially; and periodically moving the collimator into the side pocket of the chamber and bombarding the second target with ions for depositing pasting material from the second target onto the bottom of the collimator, wherein this step is performed with no wafer in the deposition chamber.

20. The method as claimed in claim 19 further comprising the step of repeating the steps of bombarding the first target and moving the collimator.

21. An apparatus comprising a deposition chamber for use in the physical vapor deposition onto a wafer, the chamber comprising:

a. a first chamber volume including:
  i. a first target of deposition material, and
  ii. means for bombarding the first target of deposition material with ions for sputtering the deposition material onto a wafer;

b. a second chamber volume coupled to the first chamber volume, the second chamber volume including:
  i. a second target of pasting material, and
  ii. means for bombarding the second target of pasting material with ions for sputtering the pasting material; and c. a moveable collimator having a first position within the first chamber volume and a second position within the second chamber volume.

22. The apparatus as claimed in claim 21 wherein the means for bombarding the first target with ions comprises:

a. means for evacuating air from the first chamber area;

b. means for introducing a partial pressure of a gas into the first chamber area;

c. means for forming a plasma of the gas; and d. means for attracting ions from the plasma to the first target to sputter the deposition material.

23. The apparatus as claimed in claim 22 further comprising a first magnetron positioned above the target for shaping the plasma and a flow of ions to the first target.

24. The deposition chamber as claimed in claim 23 wherein the means for bombarding the second target with ions comprises:

a. means for evacuating air from the second chamber area;

b. means for introducing a partial pressure of a gas into the second chamber area;

c. means for forming a plasma of the gas; and d. means for attracting ions from the plasma to the second target to sputter the pasting material.

25. The apparatus as claimed in claim 24 further comprising a second magnetron positioned below the second target for shaping the plasma and a flow of ions to the second target.

26. The apparatus as claimed in claim 25 wherein the deposition material is a reactive compound formed from a first element obtained from the first target and a second element obtained from a second gas introducible into the deposition chamber.

* * * * *